(12) United States Patent
Karanam et al.

(10) Patent No.: US 7,265,532 B2
(45) Date of Patent: Sep. 4, 2007

(54) ELECTRONIC ELECTRICITY METER AND METHOD OF ASSEMBLY

(75) Inventors: Rajaiah Karanam, Bristol, CT (US); Wayne A. Therrien, Rochester, NH (US); Robert Edward Lee, Jr., Dover, NH (US); Maurice J. Ouellette, North Berwick, ME (US); Curtis Whitmore Crittenden, Dover, NH (US); Sachin Vasantarao Kurkure, Andhra Pradesh (IN)

(73) Assignee: General Electric Company, Schenectady, NY (US)

( * ) Notice: Subject to any disclaimer, the term of this patent is extended or adjusted under 35 U.S.C. 154(b) by 193 days.

(21) Appl. No.: 10/858,823

(22) Filed: Jun. 2, 2004

(65) Prior Publication Data

US 2005/0270016 A1    Dec. 8, 2005

(51) Int. Cl.
    *G01R 11/32* (2006.01)
(52) U.S. Cl. ..................................... 324/142
(58) Field of Classification Search ........... 324/142, 324/117 R, 158.1, 765, 74, 141; 702/57, 702/60, 61, 64; 340/870.02, 870.03
    See application file for complete search history.

(56) References Cited

U.S. PATENT DOCUMENTS

| | | | |
|---|---|---|---|
| 4,491,793 A | 1/1985 | Germer et al. ............. 324/157 |
| 5,933,004 A * | 8/1999 | Jackson et al. ............. 324/142 |
| 6,605,937 B2 | 8/2003 | Germer et al. | |
| 6,665,620 B1 | 12/2003 | Burns et al. | |
| 6,734,663 B2 | 5/2004 | Fye et al. | |
| 7,005,844 B2 * | 2/2006 | De Vries et al. ........ 324/103 R |
| 2003/0111999 A1 | 6/2003 | Berkcan et al. | |

OTHER PUBLICATIONS

English, S., et al.; Application Note AN-564; Analog Devices; 2001; pp. 1-16, month unavailable.

Texas Instruments series capacitor and shunt regulator, No. PMP 332, dated Sep. 6, 2002.

* cited by examiner

*Primary Examiner*—Ha Tran Nguyen
*Assistant Examiner*—Tung X. Nguyen
(74) *Attorney, Agent, or Firm*—Cantor Colburn LLP (57) ABSTRACT

An electronic residential electricity meter includes a base assembly having a main body with a current transformer mounted thereto. A first conductor is mounted through a window of the current transformer. The current transformer being operable in the presence of a direct current. The meter also includes an electronic module that has only one printed circuit board and a microcomputer for executing meter data operations. The current transformer and the first conductor are in electrical communication with the electronic module.

25 Claims, 14 Drawing Sheets

ELECTRONIC ELECTRICITY METER AND METHOD OF ASSEMBLY

BACKGROUND OF THE INVENTION

This invention relates generally to an electronic residential electricity meter.

Typically, electrical power supplied for residential applications is single phase alternating current power. To measure the consumption of electricity in residential applications, a meter is provided at the electrical service entrance to the residence. There are generally three types of meters for residences: (1) electromechanical based meters; (2) electronic meters; and (3) hybrid electromechanical/electronic meters. The electromechanical and hybrid type meters are essentially an induction motor in which the moving element is a rotating disk. The speed of rotation of the disk is directly proportional to the voltage applied and the amount of current flowing through the motor. The phase displacement of the current, as well as the magnitude of the current, is automatically taken into account by the meter i.e., the power factor influences the speed of rotation of the disk. The result is that the disk rotates with a speed proportional to true power. In the electromechanical type of meters, a register is used to register the number of revolutions, and the gearing is arranged to be read directly in kilowatt-hours.

Electronic meters are more complex and as a result tend to be more expensive. In particular, electronic meters use multiple circuit boards, current sensors, and voltage sensors.

BRIEF SUMMARY OF THE INVENTION

Exemplary embodiments of the invention include an electronic residential electricity meter that includes a base assembly having a main body and the base assembly includes a current transformer mounted to the main body. A first conductor is mounted through a window of the current transformer. The first conductor and the current transformer are configured to measure a load current and the current transformer is configured and dimensioned to operate when the load current includes a direct current. The meter also includes an electronic module has only one printed circuit board and a microcomputer for executing meter data operations. The current transformer and the first conductor are in electrical communication with the electronic module.

Exemplary embodiments of a method of assembling an electronic residential electricity meter include mounting a first conductor and a second conductor through a window of a current transformer. The first conductor and the current transformer are configured to measure a load current and the current transformer is configured and dimensioned to operate when the load current includes a direct current. In addition, the method includes mounting the first conductor, the second conductor, and the current transformer to a base so that ends of the first conductor and the second conductor extend through to a back side of the base. The ends are configured and dimensioned to mate with a meter socket. The method also includes wiring the first conductor and the current transformer to an electronic module. The electronic module has only one printed circuit board.

DETAILED DESCRIPTION OF THE INVENTION

Figure 1:
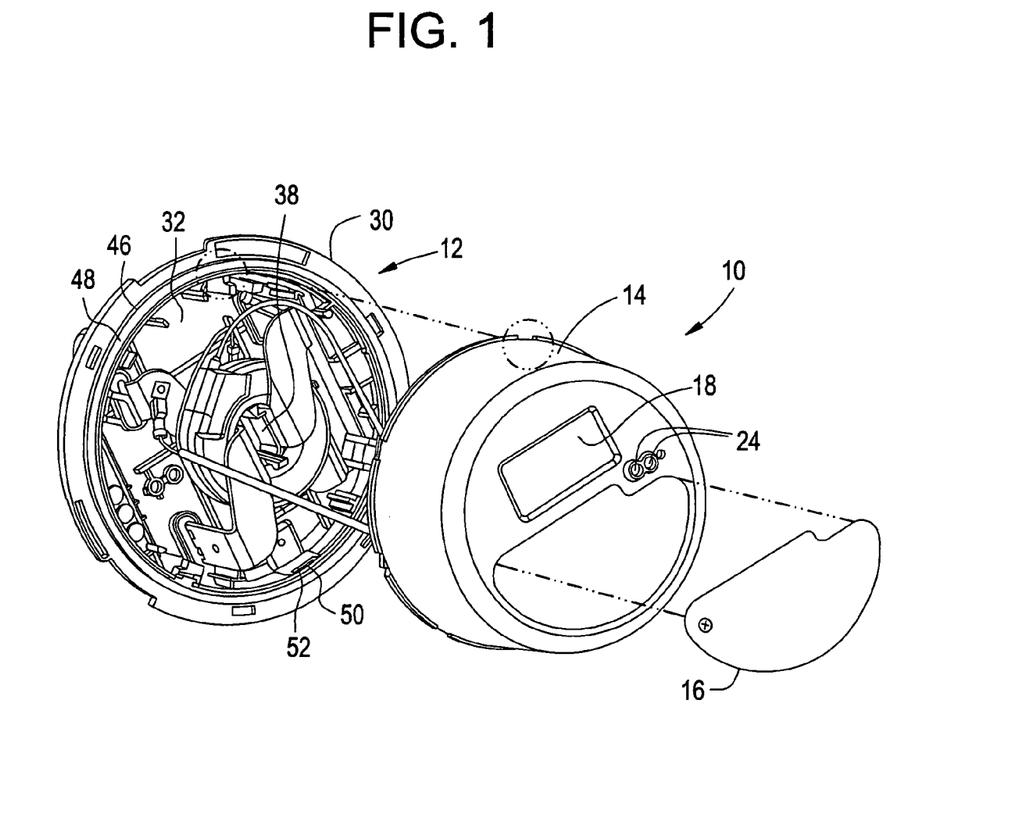
FIG. 1 is a front exploded perspective view of a base assembly and an inner cover of an electronic residential electricity meter.
Figure 2:
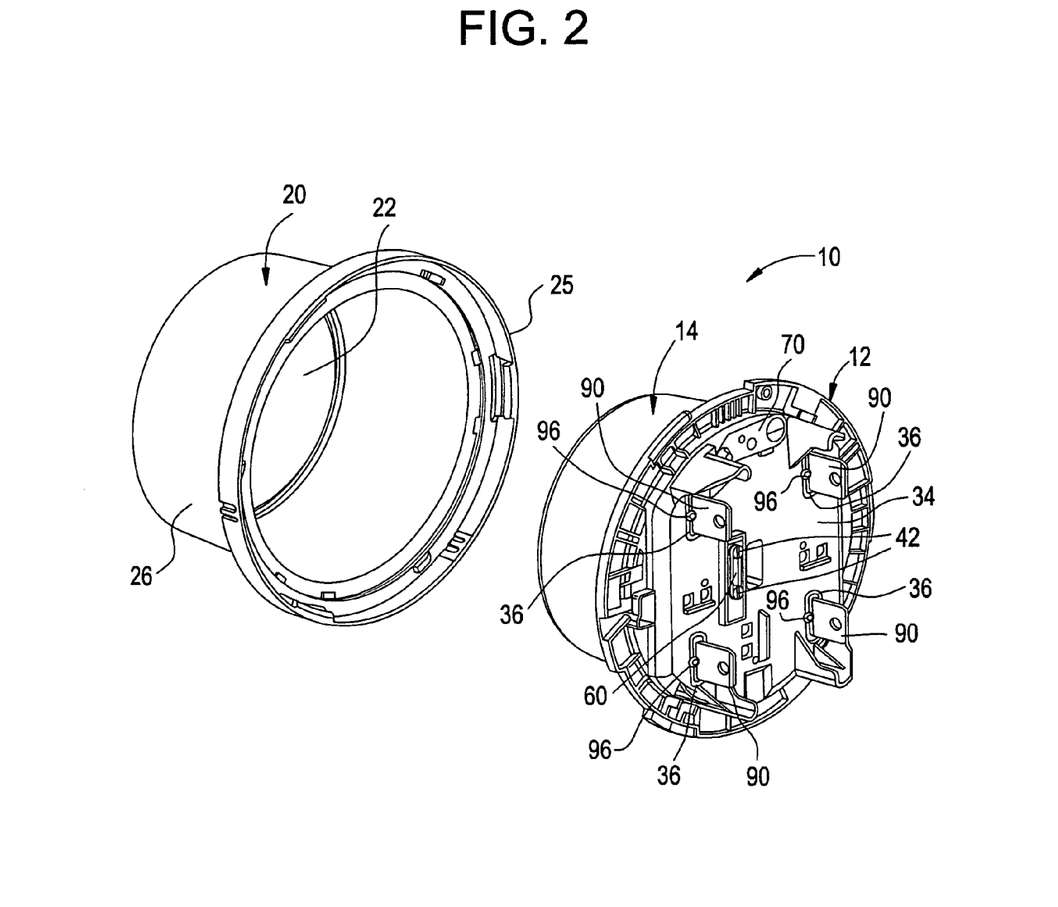
FIG. 2 is a back perspective view of the base assembly coupled to the inner cover and an exploded outer cover.

Referring to FIGS. 1 and 2 are exploded front and back views of an electronic residential electric meter 10 (meter 10). Meter 10 is modular in construction and includes a base assembly 12, an inner cover 14 with a nameplate 16 and an opening 18 for a display, and an outer cover 20 for protecting meter 10. Inner cover 14 is illustrated as being of single construction, but may also include a combined shroud and bezel. Inner cover 14 may also includes two openings 24, which allows optical communication (described in more detail below).

Outer cover 20 has a front face 22 for viewing all of the features at inner cover 14. Front face 22 is fabricated from a clear material such that at least meter nameplate 16 and liquid crystal display are visible through cover front face with meter 10 is installed and used. Front face may be made of clear lexan, glass, plastic, or some other material that is transparent. Cover 20 includes an end ring 25, a substantially cylindrical body 26 extending from end ring 25, and front face 22 attached to body 26. End ring 25 is securely attached to base assembly 12, and body 26 forms protect enclosure over inner cover 14.

Nameplate 16 is attached to a face of inner cover 14 and includes alphanumeric indicia of interest, including but not limited to a meter serial number, firmware revision codes, installed option boards, utility information and bar codes, meter type codes, meter capability codes, and meter constants for executing certain meter functions. Other items of interest may be printed on nameplate 16 in addition to or in lieu of the items described above, depending upon the end-user of the meter, the mode of the meter, and the end application of the meter.

Meter 10 is illustrated as being configured for a Form 2S, which is a standard configuration in the industry. In particular, 2S means that there is a particular wiring so that the meter can be accepted at the wire meter socket in a defined manner. Meter 10 is a single-phase meter and the operation is a single voltage (+/−20%), nominally 240 volts. Other voltages can be accommodated with variations of circuit components. Current ratings depend on the current transformer configuration and firmware scaling factors; however, it is anticipated that the current ratings are between approximately 20 amps to 320 amps.

Referring to FIGS. 1-4, base assembly 12 has a main body 30, which is illustrated in more detail. Main body 30 has a front side 32 and a back side 34. There are four slots 36, which extend through from front side 32 to back side 34 and are spaced at a standard socket size for electrical meters. Main body 30 includes a tower 38 located at approximately the center of base assembly 12 and two holes 40 located next to tower 38. Holes 40 receive test terminals 42, which are inserted into holes 40 from back side 34 and extend up through front side 32. In addition, a faston tab 44 is snapped onto test terminals 42. Generally, faston tabs 42 should withstand a pull out force of about 10 pounds. A channel 46 is located around the periphery of main body 30 and receives a gasket 48. Gasket 48 may be adhesively fixed into channel 46. Channel 46 includes a space 50 for receiving a filter 52. A first jumper 54 is fastened to faston tab 44 on one end and main body 30 at the other end. First jumper 54 may be secured between a notch 56 and tower 38. While first jumper 54 does not need to be located in any specific place in main body 30, it is prudent to secure first jumper 54 so that first jumper 54 does not move around in main body 30. A second jumper 58 is fastened to the other faston tab 44. A test link 60 is secured to test terminals 42 on back side 34. Test link 60 facilitates lab testing and is always closed during operation.

Figure 3:
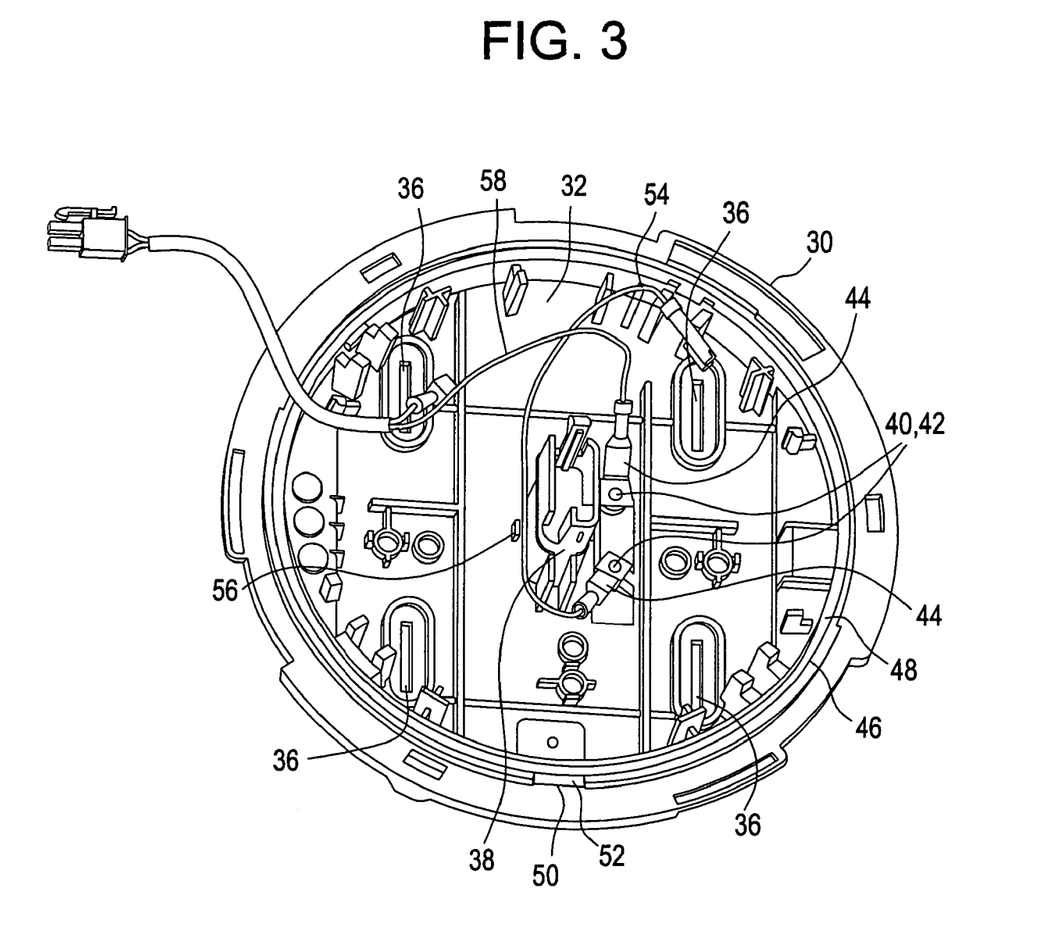
FIG. 3 is front perspective view of a main body of the base assembly of FIG. 1.
Figure 4:
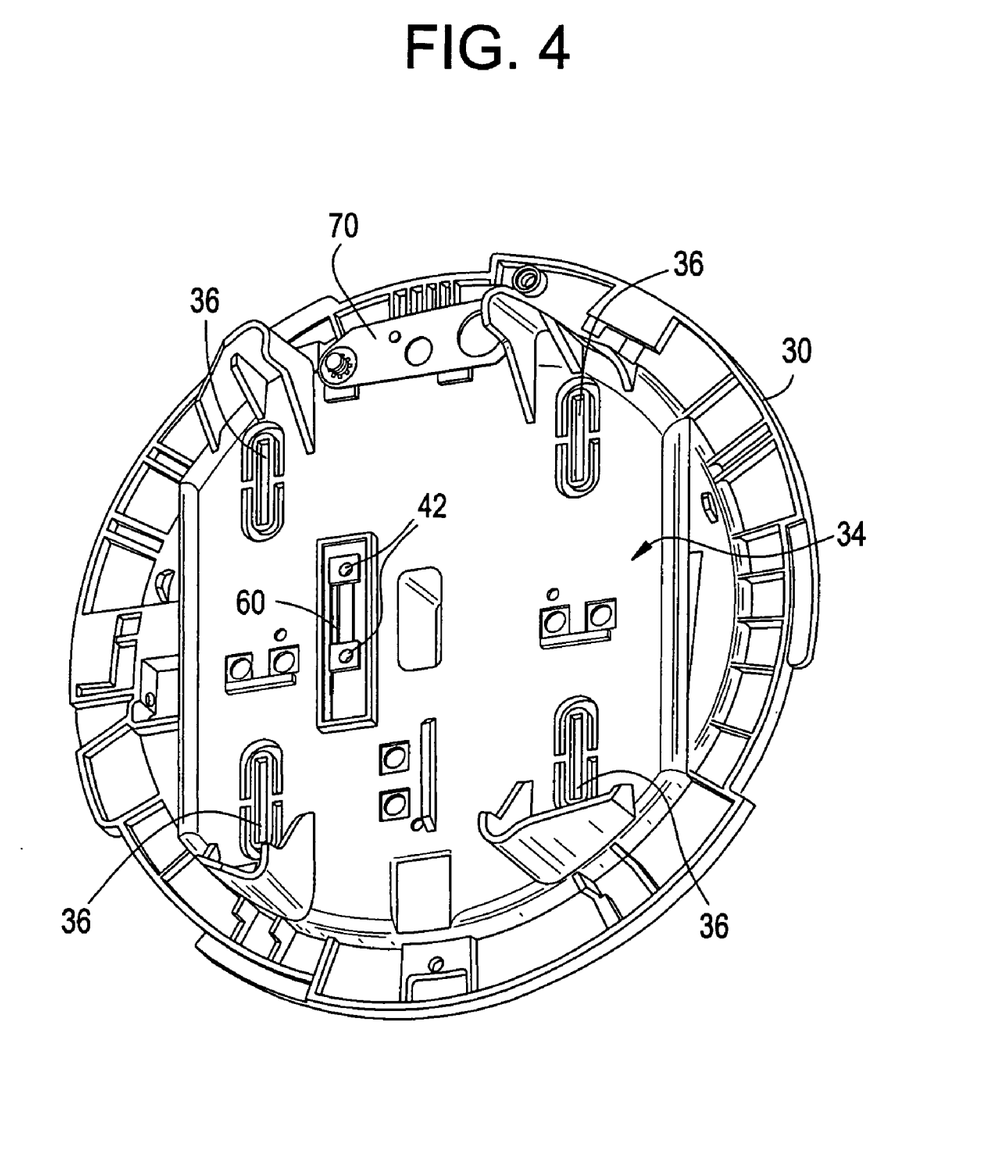
FIG. 4 is a back perspective view of the main body of the base assembly of FIG. 1.

Main body 30 includes a hangar assembly 70, which is used primarily during handling. An example of hangar assembly 70 is shown, however, any suitable hangar assembly is contemplated.

Referring to FIGS. 5-10, base assembly 12 includes a current transformer 80 and at least one (but shown as two) conductors 82, 84 that weave through a window 86 in current transformer 80. Conductors 82, 84 carry the current from the utility side through the measurement transformer to the load side where it enters the home. Tower 38 is inserted in window 86 and provides a physical separation between conductors. Because each conductor 82, 84 can have up to 240 volts between them, a separation should be maintained between conductors 82, 84. Tower 38 also serves to locate and hold current transformer 80. Conductors 82, 84 are shaped so as to come across the top of current transformer 80, down through window 86 and across the bottom of current transformer 80. Each conductor 82, 84 has two prongs 90 that insert through holes 36 so that prongs 90 extend through to back side 34 (see FIG. 2). Four prongs 90 are received by socket (not shown) at the residential house.

Figure 7:
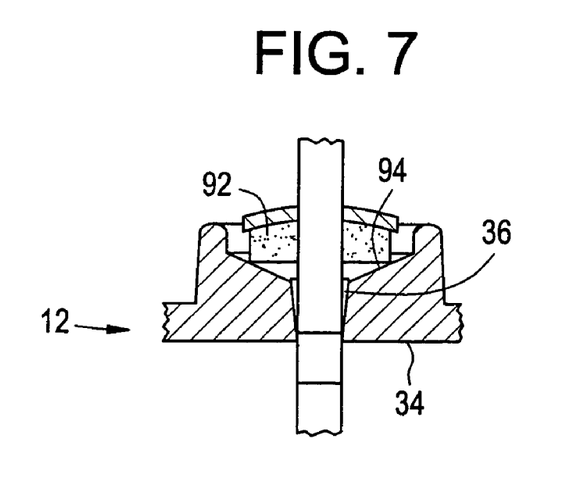
FIG. 7 is a close up side view of the conductor connecting to the base assembly of FIG. 5

Prongs 90 may be secured to base assembly 12 in any suitable manner. An exemplary embodiment for securing prongs 90 to base assembly 12 is shown in FIG. 7. A washer and gasket assembly 92 fit into sloped extensions 94 that surround holes 36. In addition, a cotter pin 96 (see FIG. 2) secures prong 90 from back side 34.

Referring again to FIG. 5-10, conductors 82, 84 are made of heavy copper and have no joints. Each conductor and associated terminal blades are formed from one continuous piece of copper for maximum reliability. Current transformer 80 has a molded body and sleeved secondary leads. Both voltage and current signal connectors are positive locking. All standard ANSI single phase forms are offered. Current ratings are 20, 200, and 320 amps.

Figure 5:
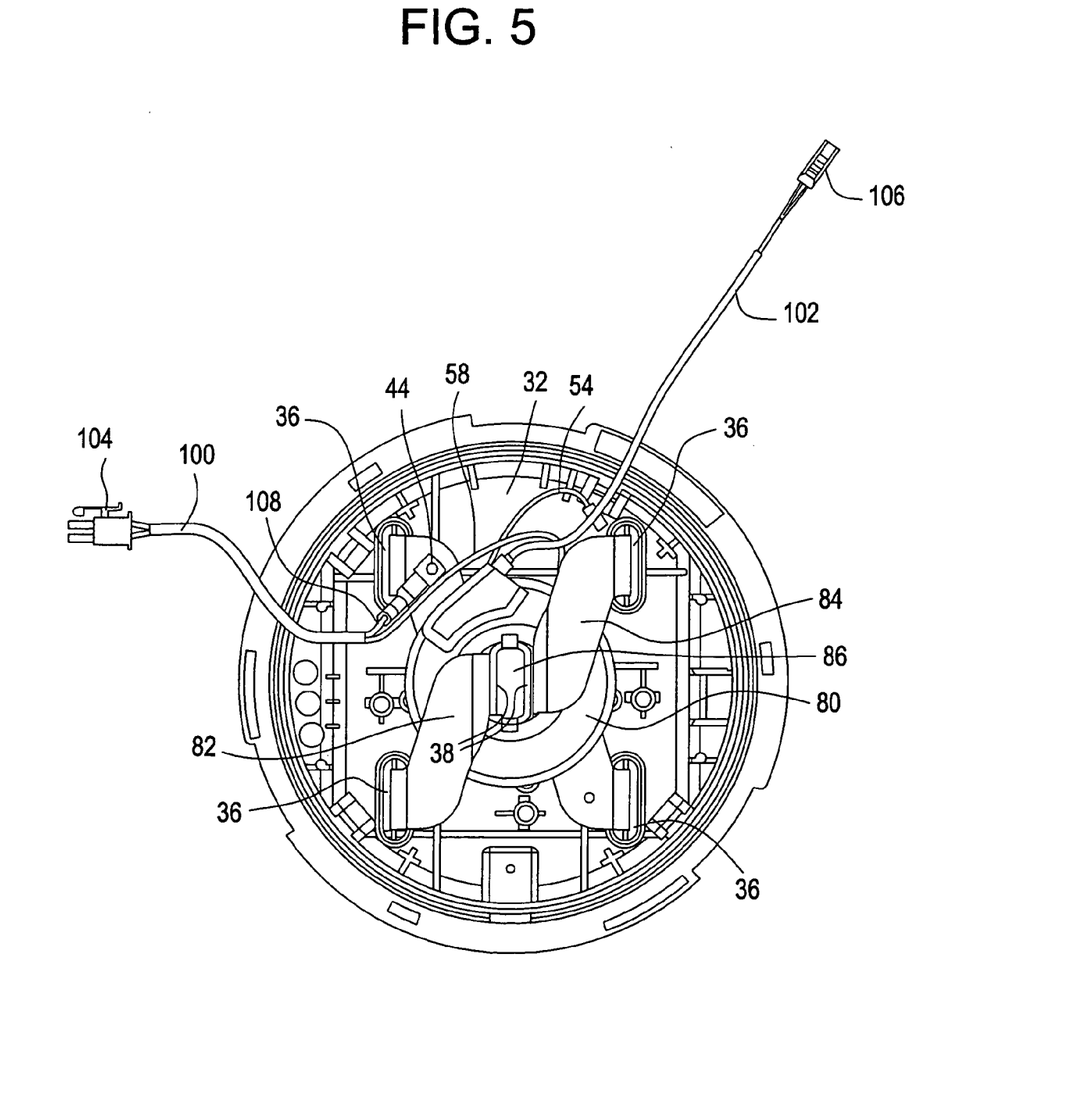
FIG. 5 is a front view of a base assembly of the electronic residential electricity meter.
Figure 6:
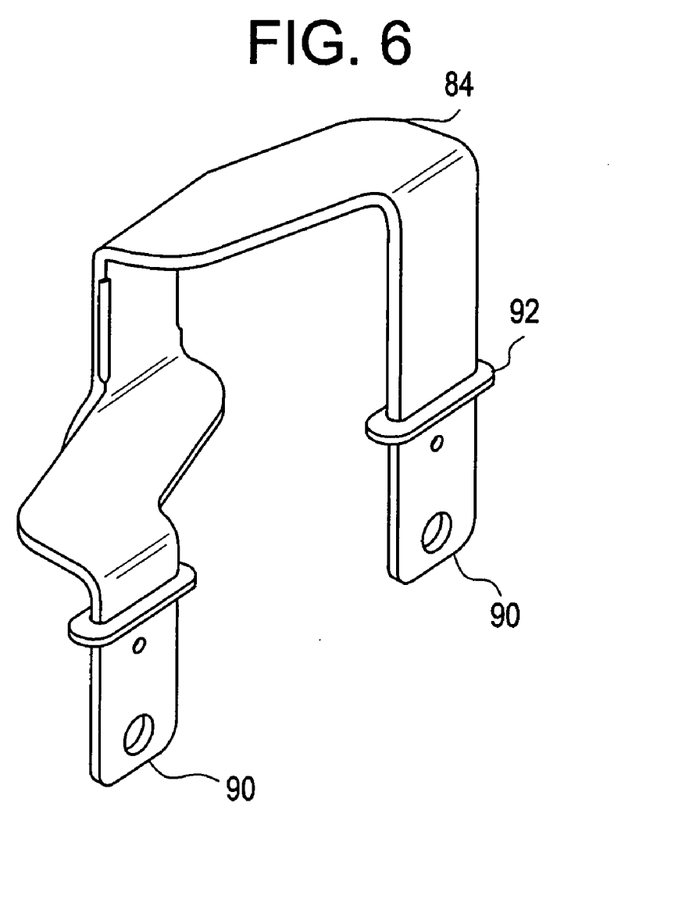
FIG. 6 is a perspective view of a conductor of the base assembly of FIG. 5.
Figure 8:
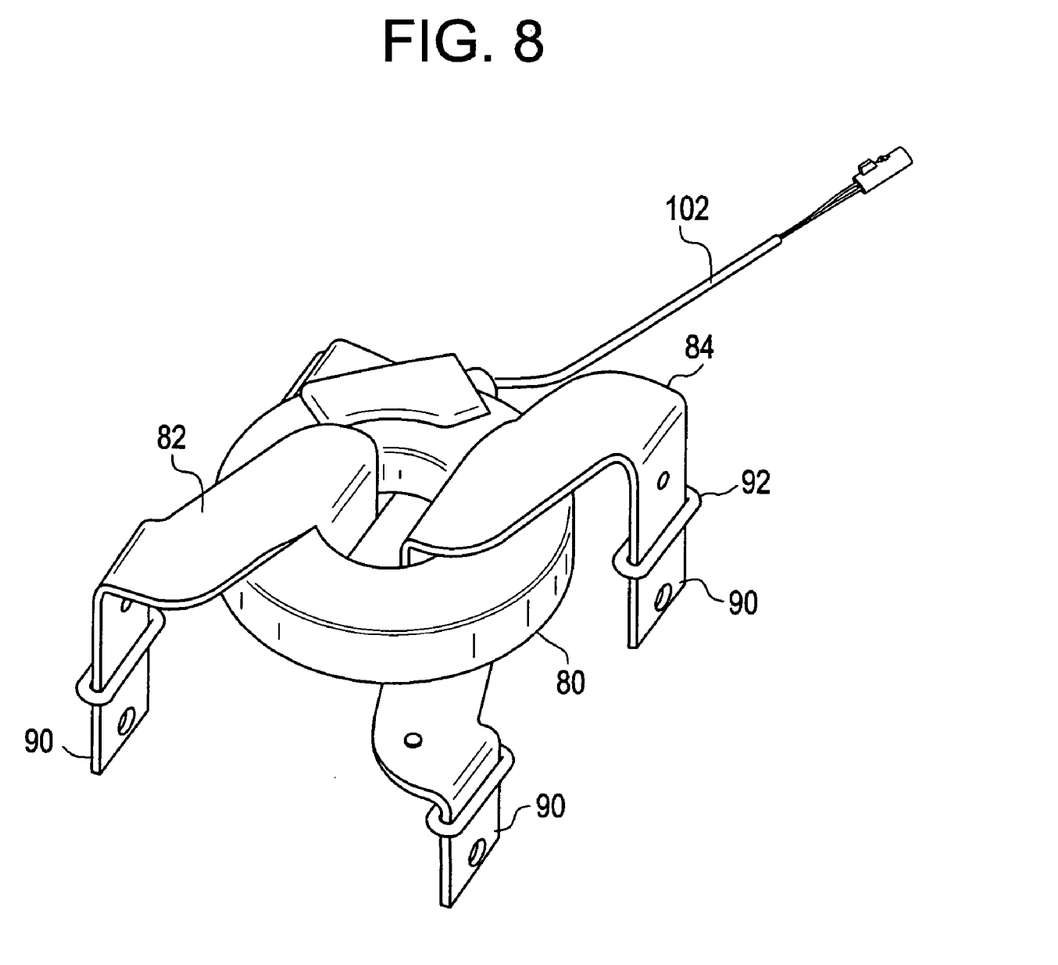
FIG. 8 is a front perspective view of the conductors and a current transformer of FIG. 5.

Current transformer 80 has partial direct current (DC) tolerance. In particular, the load current passes through window 86 and gets metered. If there is a DC component to the load current, current transformer 80 can operate properly with up to a set amount of DC in the load current. Appropriate sizing and material selection allows for the partial DC tolerance. The amount of DC tolerance is a balance between preventing tampering by homeowners and having a very large and costly current transformer. With partial DC tolerance, current transformer 80 is not easily saturated, which helps to prevent homeowner tampering. On the other hand, each conductor 82, 84 has a current rating of up to 320 amps. Thus, because the current is additive in each conductor 82, 84, current transformer has to meter up to 640 amp. If a high level of DC tolerance was incorporated, then the current transformer would be very large, which would mean higher cost and would not be very accurate. Thus, the amount of DC tolerance is an intermediate level, which takes into account the competing interests.

The use of advanced current transformer designs and materials enables a high level of performance in several ways. The meter load curve characteristic can meet the demanding requirements of ANSI standard C12.20 accuracy class 0.2 due in part to the constant magnitude and phase characteristic of the current transformer over a wide current range.

Current transformer 80 has a very constant magnitude ratio over a wide range of currents and operating conditions, such as temperature variation. It also combines good tolerance to any DC components in the load current with relatively small and constant phase shift. Due to stable core characteristics, phase shift variation with temperature is directly attributable to secondary winding copper resistance, which is known and predictable. The magnitude ratio and phase angle are calibrated electronically. The temperature variation of the phase shift is also actively compensated electronically.

Figure 9:
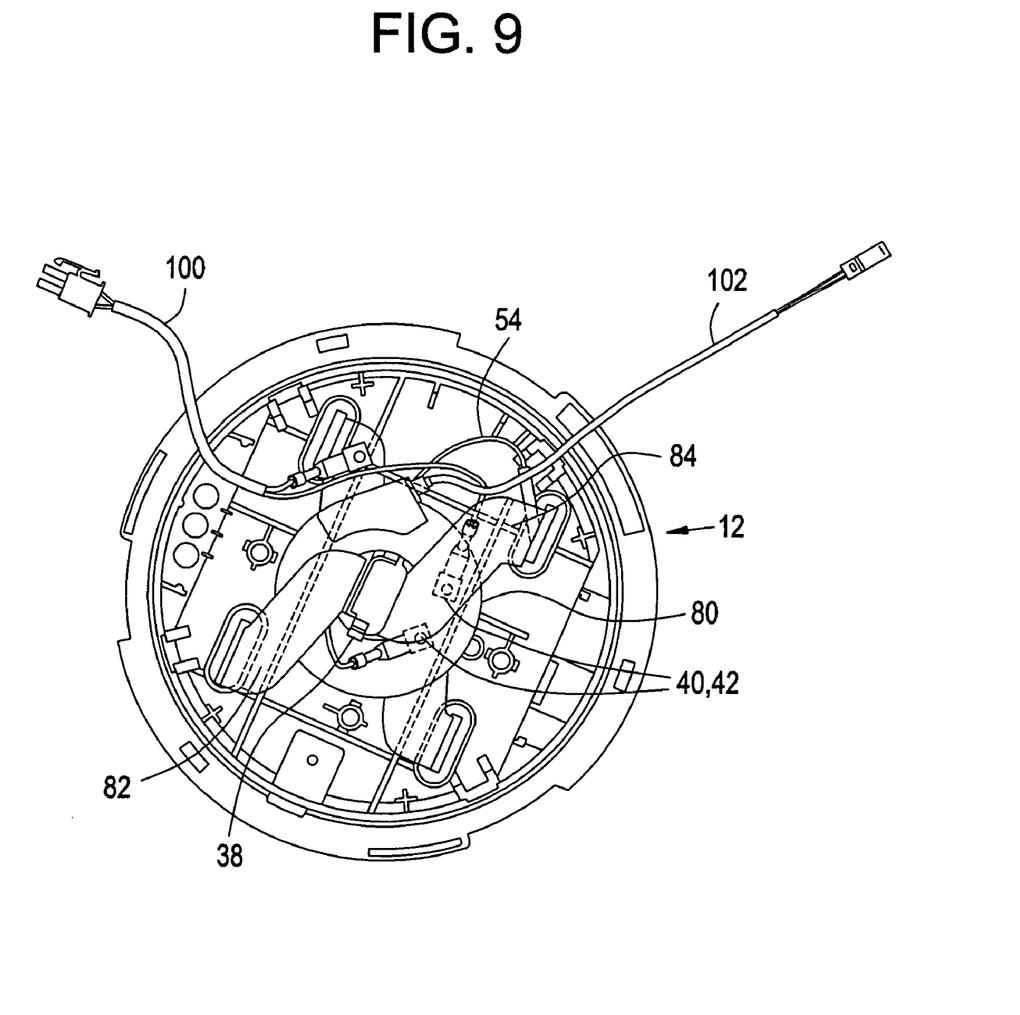
FIG. 9 is a front perspective view of the base assembly of FIG. 5.
Figure 10:
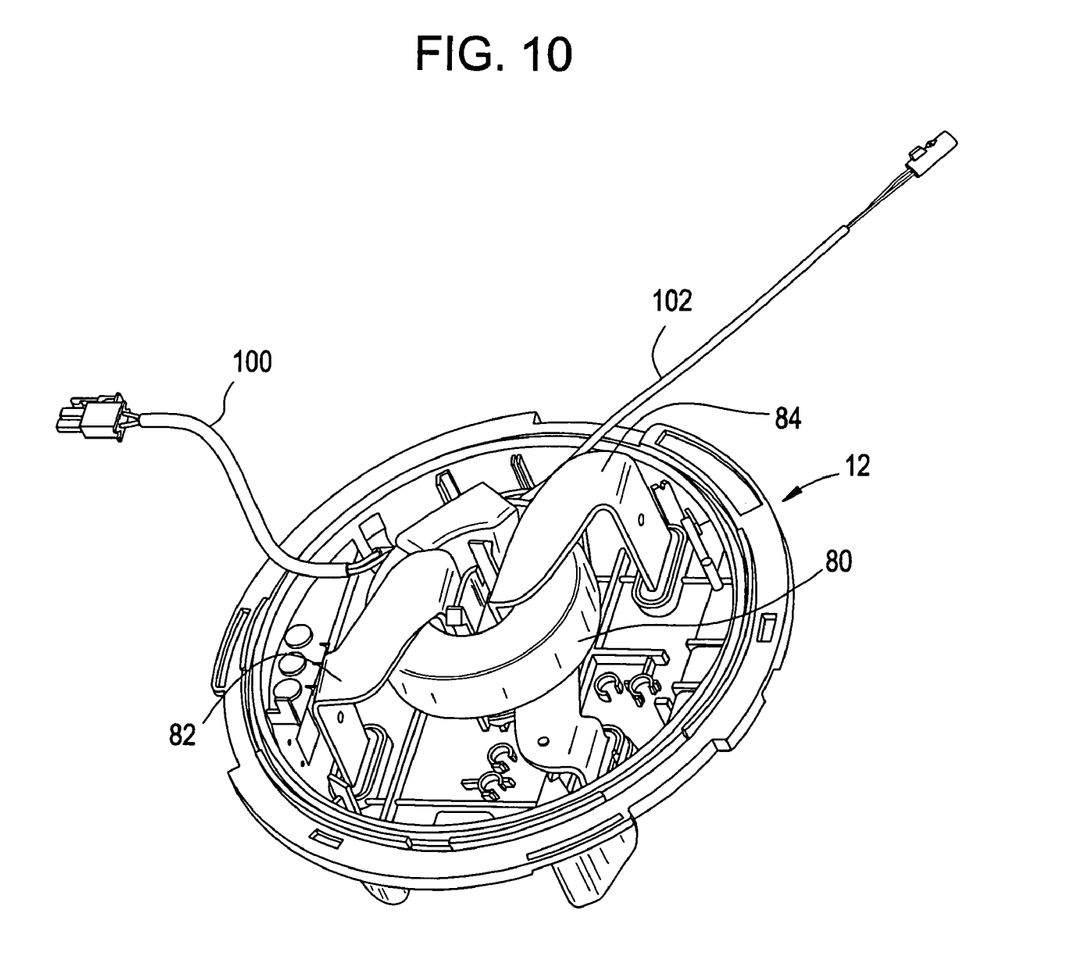
FIG. 10 is a front perspective view of the base assembly of FIG. 5.
Figure 11:
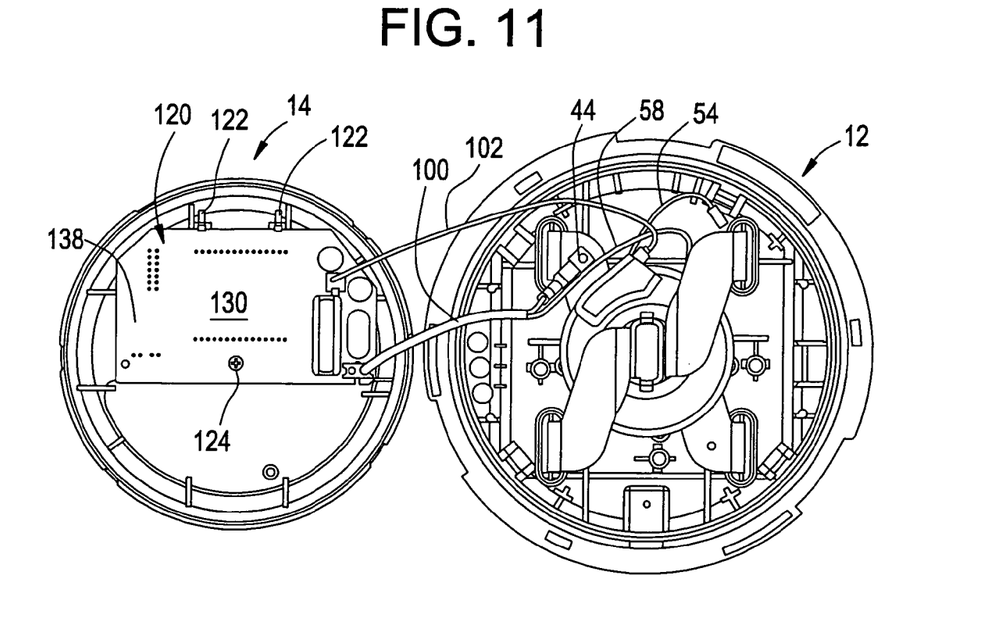
FIG. 11 is an open view of a first embodiment of the base assembly of FIG. 1 and a inner cover for holding an electronic module assembly.
Figure 12:
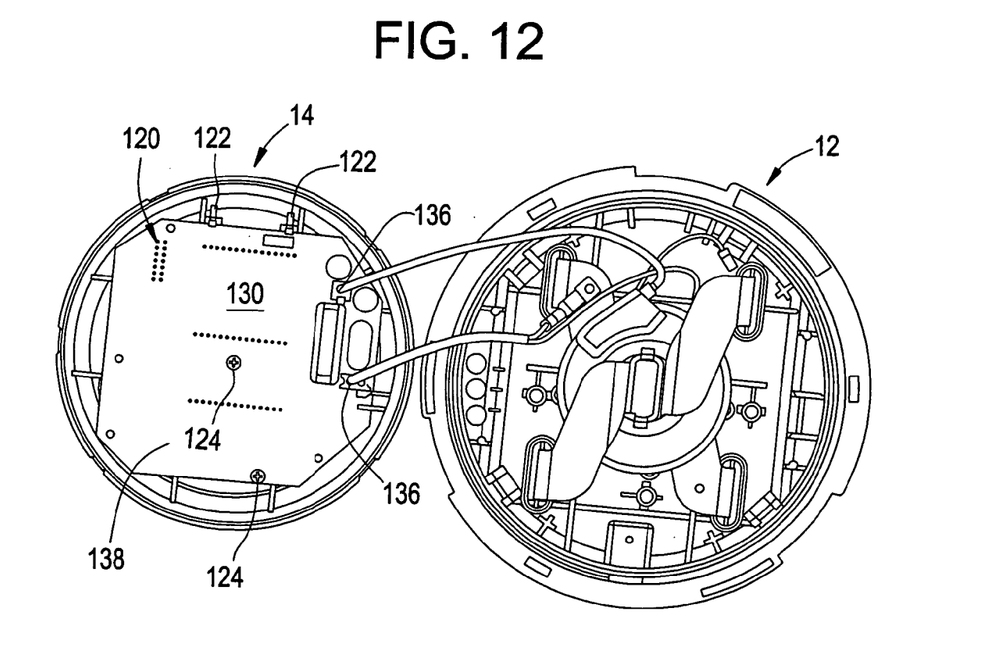
FIG. 12 is an open view of a second embodiment of the base assembly of FIG. 1 and a inner cover for holding an electronic module assembly.
Figure 13:
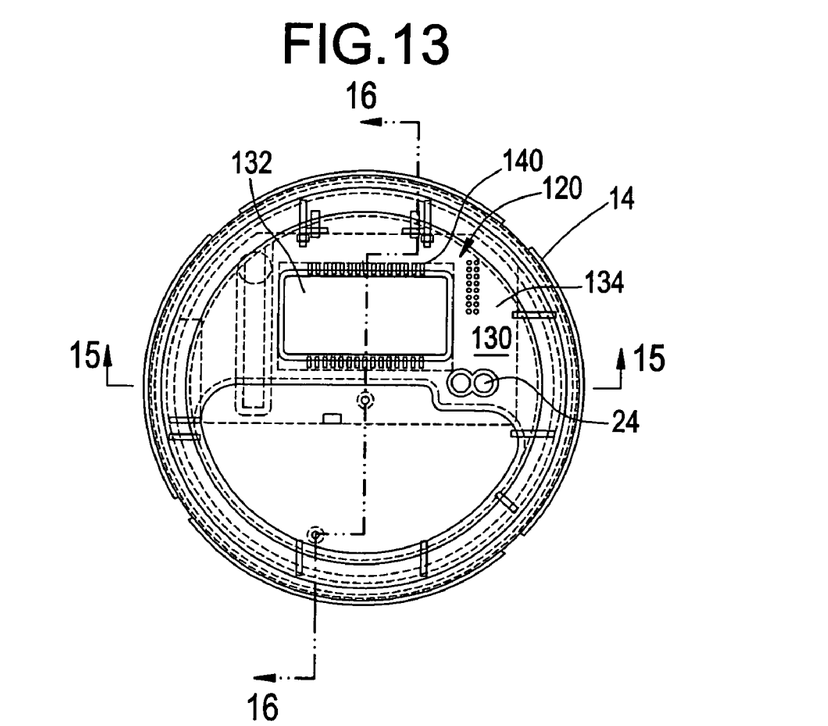
FIG. 13 is a front view of an inner cover of the electronic residential electricity meter.
Figure 14:
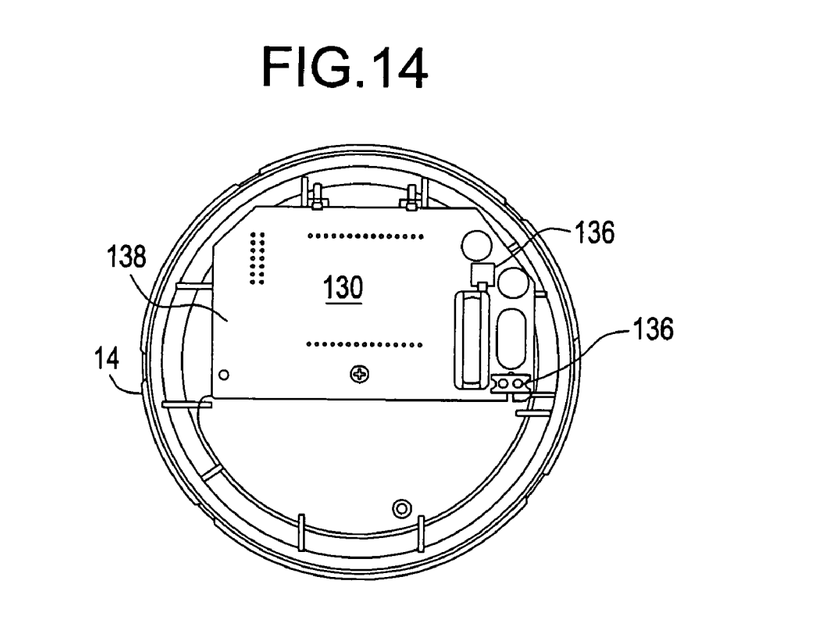
FIG. 14 is a back view of the inner cover of FIG. 13.
Figure 15:
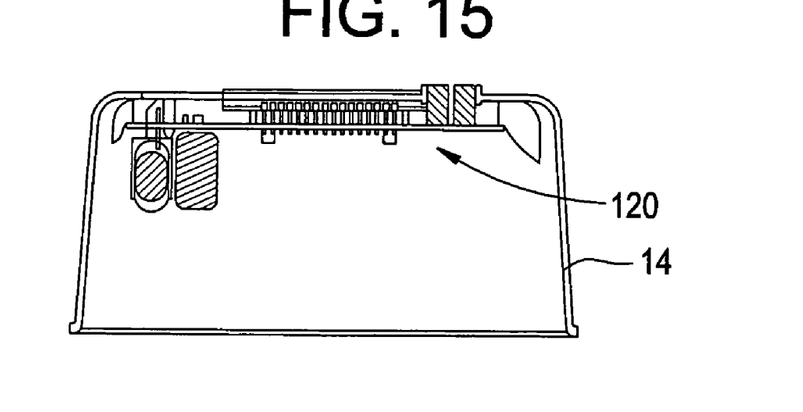
FIG. 15 is a cross-sectional view of the inner cover taken at 15-15 on FIG. 13.
Figure 16:
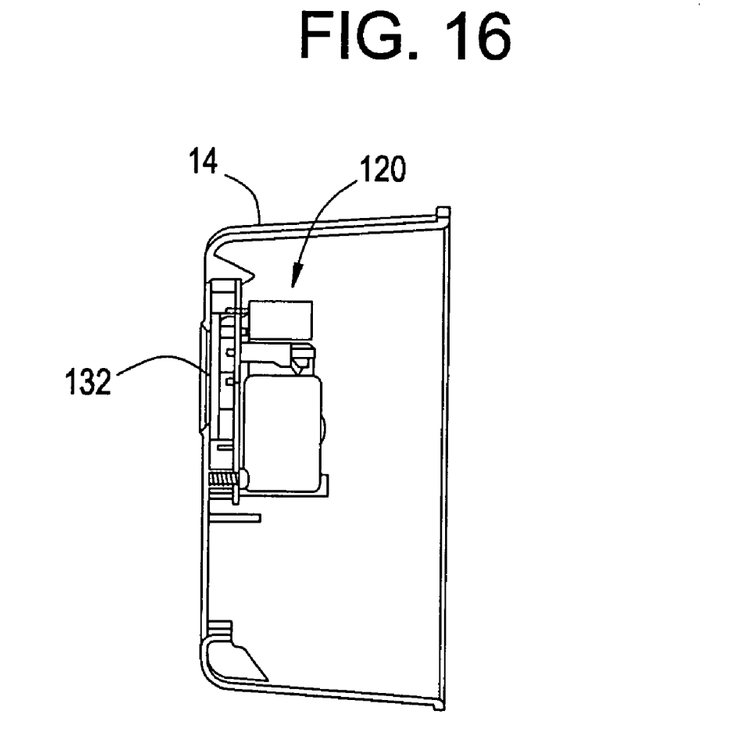
FIG. 16 is a cross-sectional view of the inner cover taken at 16-16 on FIG. 13.

Base assembly 12 also includes wire leads 100, 102 each having respective pins 104, 106. Wire lead 100 extends from conductor 82 and wire lead 102 extends from current transformer 80. Wire lead 100 includes second jumper 58 and a wire 108 that connects to test terminal 42. Faston tab 44 is used to connect wire lead 100 to conductor 82.

Referring to FIGS. 11-14, a front view of base assembly 12 is illustrated with a back view of inner cover 14. Wire leads 100, 102, extend from base assembly 12 and connect to an electronic module 120. Wire lead 100 is the voltage connection from base assembly 12 to electronic module 120. Wire lead 102 is the secondary of current transformer 80 that connects to electronic module 120. In addition, while the exemplary embodiment illustrates wire leads 100, 102 connecting current transformer 80 and conductor 82 to electronic module 120, any type of electrical communication between current transformer 80 and conductor 82 would be acceptable.

Referring to FIGS. 11-16, electronic module 120 is mounted and securely fastened to inner cover 14. Specifically, electronic module 120 slides into clips 122 and is secured to inner cover by at least one fastener 124, such as a screw. In particular, electronic module 120 has only one circuit board 130 in which a liquid crystal display 132 is located on a front side 134 of circuit board 130 and the meter connections 136 (both current and voltage) are located on a back side 138 of circuit board 130. Pins 104, 106 of wire leads 100, 102 are securely received into connectors 136.

Liquid crystal display 132 is triplex liquid crystal display, 5 volt supply and has up to 51 segments. Liquid crystal display 132 is mounted to electronic module 130 by pins 140. Liquid crystal display 132 can be viewed through opening 18 in inner cover 14 and front face 22 of outer cover (see FIG. 1).

Figure 17:
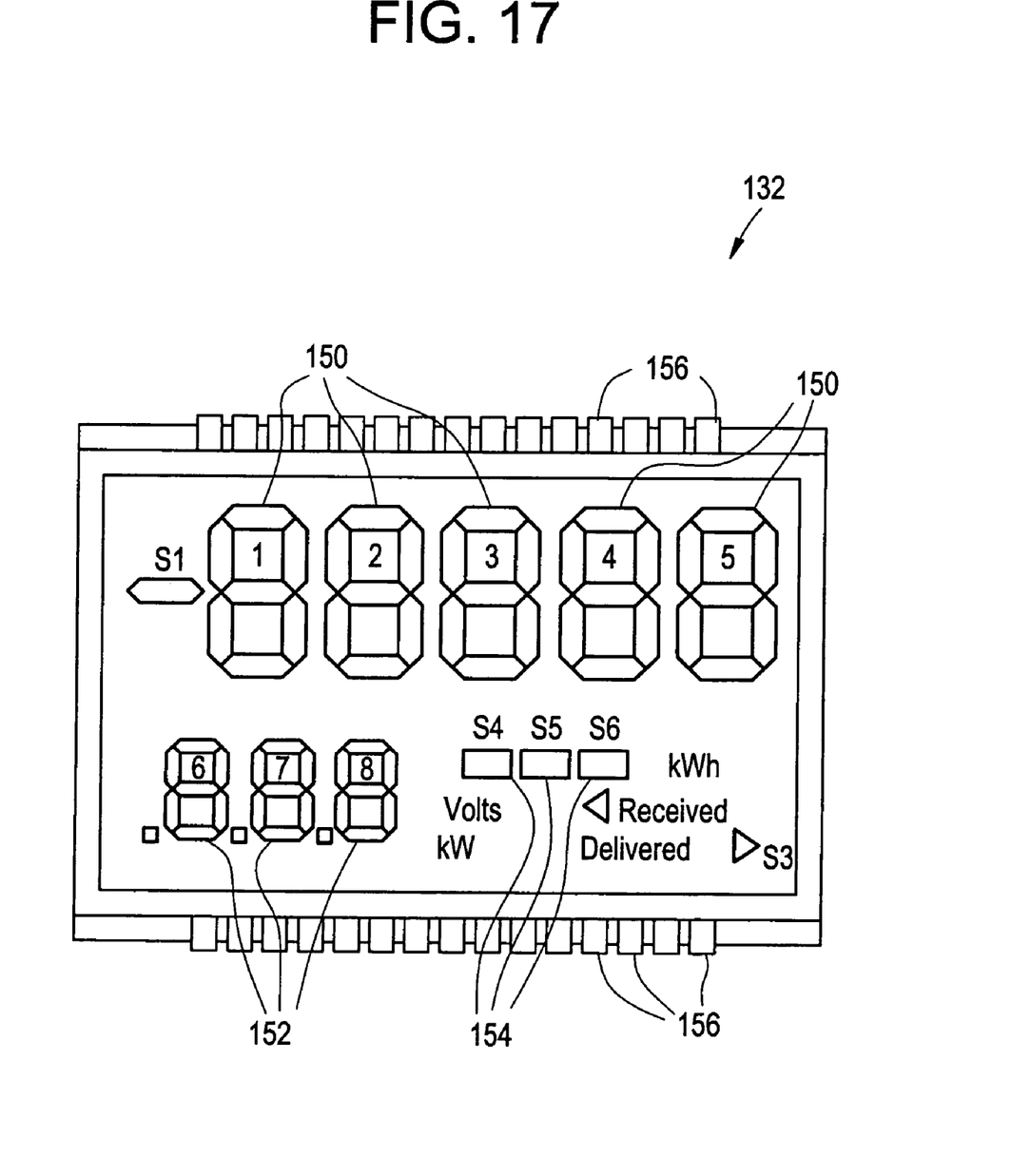
FIG. 17 is an exemplary embodiment of a liquid crystal display.

Referring to FIG. 17, an exemplary embodiment of liquid crystal display 132 is illustrated. Liquid crystal display 132 has five large digits 150 for displaying kilowatt hours, which is the basic function of the meter. Digits 150 can always display the kilowatt hours or digits 150 can alternate between kilowatt hour and an all segment display, which shows that the segments are all working and that the kilowatt hour display is correct. Display 132 also includes three smaller digits 152, which indicates secondary information such as the power level flowing through the meter or the voltage. Display 132 also has two indicators "received" and "delivered," which indicates the direction that the power is flowing. In most instances, "delivered" would be highlighted. Display 132 also includes widgets 154, which gives a visual way to gauge rate of power flow through meter by patterning light across the three widgets. Liquid crystal display 132 connects to electronic module 120 (see FIG. 13) through pins 156.

Referring again to FIGS. 11-16, electronic module 120 can vary in size to accommodate additional features. If a small board is utilized, such as the rectangular one illustrated in FIGS. 11, 13, and 14, then meter 10 would function as an energy measurement only meter. If a larger board is utilized, such as the one illustrated in FIG. 12, then the board can accommodate more circuitry, which would accommodate both metering functions and automatic meter reading functions. Inner cover 14 accepts the different size circuit boards 130 with the same mounting so as to accommodate various features.

Figure 18:
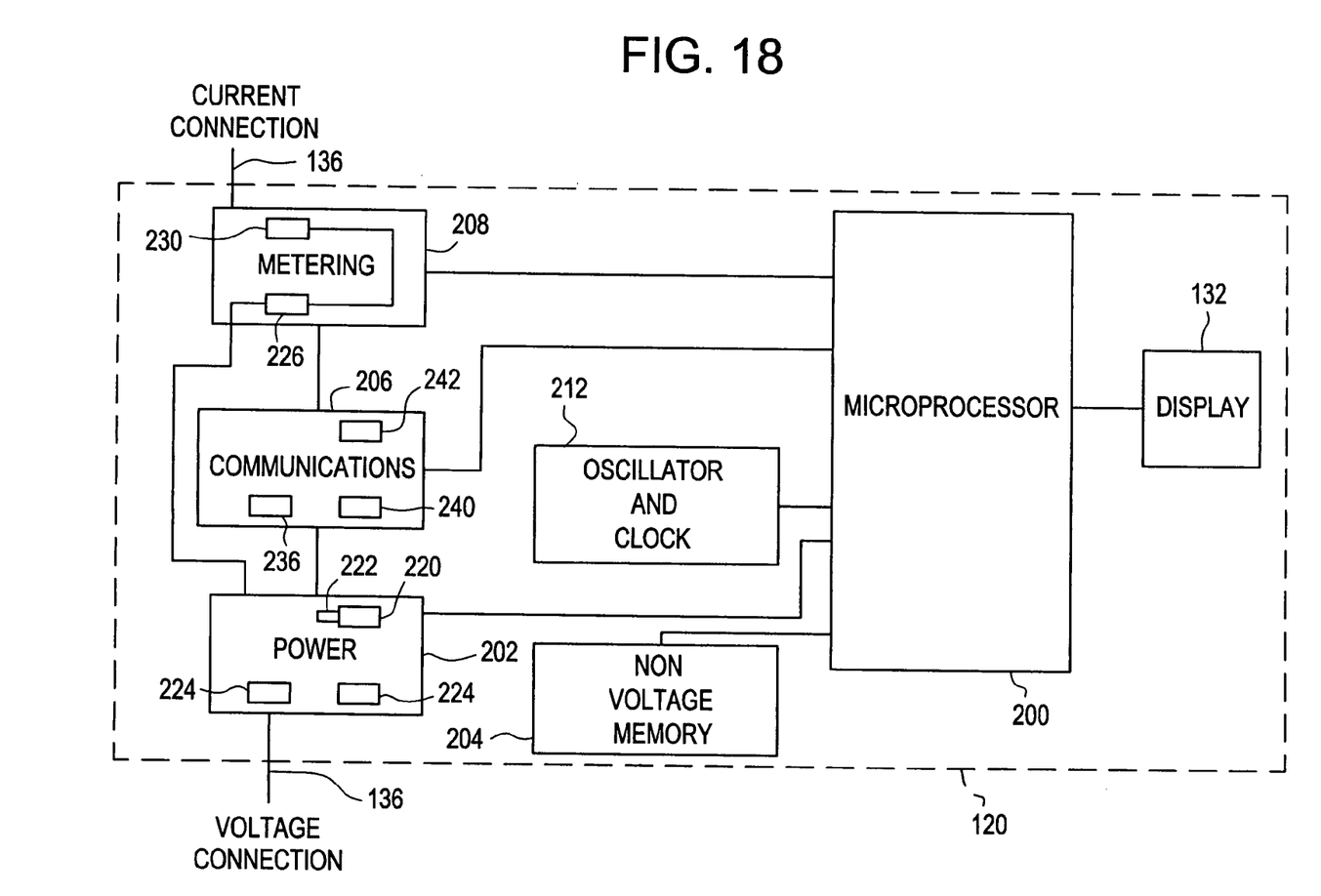
FIG. 18 is block diagram of an electrical schematic diagram of an electronic module assembly for the electronic residential electricity meter.

Referring to FIG. 18, an exemplary embodiment of an electrical schematic of electronic module 120 for meter 10. Meter 10 is rated for 240-volts alternating current. Electronic module 120 includes a microcomputer 200, is a 64 pin device for connecting to the various features. Microcomputer 200 is electrically coupled to a power supply 202, a non-volatile memory 204, communications input/output 206, metering circuit 208, and oscillator and clock distribution 212. Liquid crystal display 132 is electrically coupled to microcomputer 200. Microcomputer 200 controls and communicates with each of the features that are electrically coupled with the microcomputer. In an exemplary embodiment, certain components of power supply 202 and metering connections 136 are located on back side 138, while non-volatile memory 204, communications input/output 206, metering circuit 208, and oscillator and clock distribution 212, and liquid crystal display 132 are located on front side 134. The location of the components provides for ease of use of meter 10.

Microcomputer 200 has its own internal memory, processing, and timers. In an exemplary embodiment, microcomputer 200 is commercially available, off the shelf.

Non-volatile memory 204 is a serial interface EEPROM, a communications input/output 206, a metering circuit 208, and an oscillator/clock 212. Non-volatile memory 204 may be wired to accommodate two different type of memory features. Non-volatile memory 204 is used for data and configurable parameters that are used in meter 10. Memory 204 continues to hold data even when there is no power.

Power supply 202, which operates as a 240-volt (plus or minus 20%) and can accommodate a metal oxide veristor to protect the electronic module 120 from lightening strikes, etc. Power supply 202 includes a shunt regulator 220 with a series capacitor 222 and two voltage detectors 224 for monitoring power failure, providing an orderly power up and shut down, etc.

Power supply 202 is electrically coupled with metering circuit 208. In metering circuit 208, the voltage from power supply 202 travels through a voltage divider 226 before connecting with a chip 230. Metering circuit 208, and in particular chip 230, measures the current and the voltage. Chip 230 communicates the information to microcomputer, which then calculates power that is consumed, integrates the power over time, accumulates the energy that is being measured. Chip 230 has an internal voltage reference and temperature monitor.

Power supply 202 has a 5-volt supply to supply both chip 230 and microcomputer 200. Shunt regulator 220 controls the 5-volt supply to ensure that the voltage does not exceed 5-volts. Power supply 202 provides for low power consumption, which is typically less than 100 milliwatts of power at 5-volts DC. This enables the use of a simple, low cost series capacitor 222 and shunt regulator 224 with the entire meter power of about 0.5 watts at rated voltage.

Communications input/output 206 has a reed switch 236; however, it is not required for the circuit. Reed switch 236 is another way of communicating with microcomputer 200. Communications input/output 206 also includes an optical communications feature, which includes an Optocom™. Communications input/output 206 includes a light emitting diode 240 and a phototransistor 242. Both light emitting diode 240 and phototransistor 242 allow a person to communicate with meter 10 without opening the meter. An optical probe (not shown), which also includes a light emitting diode and phototransistor, is held in front of opening 24 (see FIG. 1), and the probe sends commands from its light emitting diode to phototransistor 242, which are interpreted by microcomputer 200. Microcomputer 200 can respond through phototransistor 242 and light emitting diode 240. The optical communication feature can be used to read the meter, configure the meter, reset the registration, and detect and fix errors. Such communications features are not required for the meter to function properly; however, such features enhance the meter for the end user.

Oscillator/clock 212 provides for cycle instruction cycle time and operates in full speed mode. Microcomputer 200 can provide a signal to oscillator/clock 212 to turn off clock 212; however, this function is not required.

Meter 10 provides for the following: reduced cost, clear display, withstand load current that has a DC component (rectified loads), product family including various meter configurations, automatic meter reading requirements, high accuracy in a wide range of operating conditions, easy configuration and communication, low power consumption, high reliability, and stable performance. In particular, the single current transformer 80 and conductors 82 provide for a simple, robust electronic residential electricity meter. Electronic module 120 is simplified in that there is only a single circuit board. Inner cover 14 can receive variable size electronic module 120 so that additional features can be added to the single circuit board. Thus, the circuit board is larger for more functions and smaller for less functions. In addition, current transformer 80 has a partial level of DC tolerance so as to prevent tampering with meter 10. Liquid crystal display 132 is an easy to read display that constantly displays the kilowatthours so that there is no confusion as to what number is being displayed. Display 132 also provides for other indicators to provide additional information. Meter 10 also includes optical communications 208 for communicating with meter 10.

While the invention is described with reference to meter 10, it is contemplated that the benefits of the invention accrue to alternative types and configurations of electric meters. Consequently, the description set forth above is for illustrative purposes only, and is not intended to restrict or limit the invention to any particular electronic residential electricity meter.

In addition, while the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. An electronic residential electricity meter comprising:
   a base assembly having a main body, said base assembly includes:
   a current transformer mounted to said main body;
   a first conductor mounted through a window of said current transformer, said current transformer being operable in the presence of a direct current;
   a second conductor mounted through said window of said current transformer, said first conductor being separated from said second conductor;
   an electronic module having only one printed circuit board, said current transformer and said first conductor are in electrical communication with said electronic module; and
   a microcomputer configured to execute meter data operations.

2. The meter of claim 1, further comprising an inner cover mounted to said base assembly, said electronic module is mounted to an inside of said inner cover.

3. The meter of claim 2, wherein said inner cover accommodates said printed circuit board in varying sizes.

4. The meter of claim 1, further comprising an outer cover enclosing said inner cover and mounted to said base assembly, said outer cover having a front face that is at least partially transparent.

5. The meter of claim 1, wherein said first conductor and said second conductor each have two ends that extend through said main body to a back side, said ends are configured and dimensioned to mate with a meter socket.

6. The meter of claim 1, wherein said electronic module includes a display disposed on said printed circuit board, said display is in communication with said microcomputer.

7. The meter of claim 6, wherein said display is a liquid crystal display including first section that is configured to constantly display a measured energy quantity, a second section that is configured to display a rate of power flow, and a third section that is configured to display a current power demand.

8. The meter of claim 1, wherein said electronic module includes a communications port disposed on said printed circuit board, said communications port is in communication with said microcomputer.

9. The meter of claim 8, wherein said communications port includes a phototransistor and light emitting diode for communicating with an optical probe.

10. The meter of claim 1, wherein said electronic module includes a metering circuit disposed on said printed circuit board, said metering circuit is in electronic communication with said microcomputer.

11. The meter of claim 10, wherein said current transformer is in electrical communication with said metering circuit.

12. The meter of claim 10, wherein said metering circuit includes a chip that is adapted to measure a current and a voltage.

13. The meter of claim 10, wherein said electronic module includes a power supply disposed on said printed circuit board, said power supply is in communication with said microcomputer and said metering circuit, said power supply provides power to said chip and said microcomputer.

14. The meter of claim 13, wherein said first conductor is in electrical communication with said power supply.

15. The meter of claim 13, wherein said power supply includes a series capacitor and a shunt regulator.

16. The meter of claim 1, wherein said electronic module includes a non-volatile memory disposed on said printed circuit board, said non-volatile memory is in communication with said microcomputer.

17. The meter of claim 1, wherein said electronic module includes an oscillator and clock distribution disposed on said printed circuit board, said oscillator and clock distribution is in communication with said microcomputer.

18. An electronic residential electricity meter comprising:
    a base assembly having a main body, said base assembly including;
    a current transformer mounted to said main body;
    a first conductor mounted through a window of said current transformer, said current transformer being operable in the presence of a direct current;
    an electronic module having only one printed circuit board, said current transformer and said first conductor being in electrical communication with said electronic module;
    a microcomputer configured to execute meter data operations; and
    a liquid-crystal display disposed on said printed circuit board, said display being communication with said microcomputer and including a first section configured to constantly display a measured energy quantity, a second section configured to display a rate of power flow, and a third section configured to display a current power demand.

19. The meter of claim 18, wherein said electronic module includes a communications port disposed on said printed circuit board, said communications port is in communication with said microcomputer.

20. The meter of claim 19, wherein said communications port includes a phototransistor and light emitting diode for communicating with an optical probe.

21. The meter of claim 18, wherein said electronic module includes a metering circuit disposed on said printed circuit board, said metering circuit is in electronic communication with said microcomputer.

22. The meter of claim 21, wherein said electronic module includes a power supply disposed on said printed circuit board, said power supply is in communication with said microcomputer and said metering circuit, said power supply provides power to said chip and said microcomputer.

23. An electronic residential electricity meter comprising:
a base assembly having a main body, said base assembly including:
a current transformer mounted to said main body;
a first conductor mounted through a window of said current transformer, said current transformer being operable in the presence of a direct current;
an electronic module having only one printed circuit board, said current transformer and said first conductor being in electrical communication with said electronic module;
a microcomputer configured to execute meter data operations; and
a communications port disposed on said printed circuit board, said communications port being in communication with said microcomputer and including a phototransistor and light emitting diode for communicating with an optical probe.

24. The meter of claim 23, wherein said electronic module includes a metering circuit disposed on said printed circuit board, said metering circuit is in electronic communication with said microcomputer.

25. The meter of claim 24, wherein said electronic module includes a power supply disposed on said printed circuit board, said power supply is in communication with said microcomputer and said metering circuit, said power supply provides power to said chip and said microcomputer.

\* \* \* \* \*